(12) United States Patent
Schelling et al.

(10) Patent No.: US 10,830,590 B2
(45) Date of Patent: Nov. 10, 2020

(54) MICROMECHANICAL SENSOR

(71) Applicant: Robert Bosch GmbH, Stuttgart (DE)

(72) Inventors: Christoph Schelling, Stuttgart (DE); Ricardo Zamora, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 171 days.

(21) Appl. No.: 15/867,433

(22) Filed: Jan. 10, 2018

(65) Prior Publication Data

US 2018/0202807 A1 Jul. 19, 2018

(30) Foreign Application Priority Data

Jan. 18, 2017 (DE) .................. 10 2017 200 725

(51) Int. Cl.
*G01C 19/5712* (2012.01)
*B81C 1/00* (2006.01)
*G01L 9/00* (2006.01)
*G01L 9/12* (2006.01)
*G01P 15/08* (2006.01)
*G01P 15/125* (2006.01)

(52) U.S. Cl.
CPC ...... *G01C 19/5712* (2013.01); *B81C 1/00182* (2013.01); *B81C 1/00357* (2013.01); *G01L 9/0005* (2013.01); *G01L 9/12* (2013.01); *G01P 15/0802* (2013.01); *G01P 15/125* (2013.01); *B81C 2201/014* (2013.01); *B81C 2201/019* (2013.01)

(58) Field of Classification Search
CPC ............ G01C 19/5712; G01C 19/5642; G01C 19/5656; B81C 1/00357; B81C 1/00182; B81C 2201/014; B81C 2201/0128; B81C 2201/019; G01L 9/12; G01L 9/0005; G01P 15/0802; G01P 15/125; G01P 2015/0862; G01P 15/0882; G01P 15/097
USPC .......................... 73/504.12–504.16, 514.29, 73/504.02–504.04, 702–704, 717, 718, 73/724
See application file for complete search history.

(56) References Cited

U.S. PATENT DOCUMENTS

| | | | |
|---|---|---|---|
| 5,723,353 A | 3/1998 | Muenzel et al. | |
| 5,987,989 A | 11/1999 | Yamamoto et al. | |
| 6,892,575 B2 | 5/2005 | Nasiri et al. | |
| 8,823,007 B2 | 9/2014 | Yang | |
| 2012/0025333 A1* | 2/2012 | Yoshida | B81C 1/00587 257/415 |

(Continued)

FOREIGN PATENT DOCUMENTS

DE 19537814 B4 11/2009
WO 2014066978 A1 5/2014

*Primary Examiner* — Robert R Raevis
(74) *Attorney, Agent, or Firm* — Norton Rose Fulbright US LLP; Gerard Messina

(57) ABSTRACT

A micromechanical sensor includes a base substrate, a cap substrate, and a MEMS substrate that is connected to each of the base and cap substrates by respective metallic bond connections and that includes a mechanical functional layer including movable MEMS elements, an electrode device for acquiring an indication of a movement of the MEMS elements and fashioned by layer deposition, and a sacrificial layer that is lower than the mechanical function layer, is fashioned by layer deposition, and is omitted in a region underneath the movable MEMS elements.

10 Claims, 3 Drawing Sheets

(56) References Cited

U.S. PATENT DOCUMENTS

| | | | |
|---|---|---|---|
| 2013/0175643 A1* | 7/2013 | Berthelot | B81C 3/008 |
| | | | 257/415 |
| 2015/0336790 A1 | 11/2015 | Geen et al. | |
| 2016/0187372 A1* | 6/2016 | He | G01P 15/125 |
| | | | 73/514.32 |

* cited by examiner

MICROMECHANICAL SENSOR

CROSS-REFERENCE TO RELATED APPLICATIONS

The present application claims priority under 35 U.S.C. § 119 to DE 10 2017 200 725.7, filed in the Federal Republic of Germany on Jan. 18, 2017, the content of which is hereby incorporated by reference herein in its entirety.

FIELD OF THE INVENTION

The present invention relates to a micromechanical sensor and to a method for producing a micromechanical sensor.

BACKGROUND

Micromechanical inertial sensors for measuring acceleration and rotational rates are known and are produced in large numbers for various automotive and consumer applications. A mechanical functional layer of known inertial components is produced either from a polycrystalline material through growth, as is known for example from DE 195 37 814 B4, U.S. Pat. No. 5,723,353, WO 2014/066978 A1, or U.S. Pat. App. Pub. No. 2015/0336790. The mechanical functional layer can also be produced from a monocrystalline material, as is known for example from U.S. Pat. No. 5,987,989, through a layer transfer method in which one layer is functionally coupled to another layer.

However, the layer transfer method known for example from U.S. Pat. No. 6,892,575 has the disadvantage that an electrode spacing of vertical electrodes is not very well-defined due to the bonding method used, having a liquid phase, which results in a large degree of process scatter, thus making a capacitive evaluation more difficult or reducing yield.

U.S. Pat. No. 8,823,007 discloses a method having a monocrystalline functional layer, in which however low parasitic capacitances and stable internal pressures cannot be produced due to outgassing CMOS-BEOL (back end of line) layers.

In the two methods just mentioned, it is not possible to realize larger cavern volumes on both sides of the functional layer in order to keep an increase in the internal pressure as low as possible over the lifetime of the equipment.

SUMMARY

An object of the present invention is to provide an improved micromechanical sensor.

According to a first aspect, this object can achieved by a micromechanical sensor that includes: a first substrate, there being fashioned in the first substrate a mechanical functional layer having movable MEMS elements, a sacrificial layer, and an electrode device for acquiring a movement of the MEMS elements, where the sacrificial layer and the electrode device are fashioned by a layer deposition, the sacrificial layer being removed in a region underneath the movable MEMS elements; a second substrate, as base substrate; and a third substrate, as cap substrate, where the first substrate is connected to the second and third substrates by mechanical bond connections.

In this way, a distance, defined by the sacrificial layer region, between the movable MEMS elements and a vertical electrode can advantageously be set very precisely due to a production of the named elements by layer deposition. A high degree of detection quality of the micromechanical sensor is advantageously supported in this way. Advantageously, in this way only low demands are made with regard to the roughness of the surfaces that are to be bonded. In addition, it is advantageous that, if there are particles on the surfaces to be bonded, these particles are absorbed by a liquid phase of the bond connection and do not further interfere with the bonding process. This advantageously results in a higher production yield.

According to a second aspect, the object is achieved by a method for producing a micromechanical sensor, the method including: providing a first substrate; applying a sacrificial layer on the first substrate; forming an electrode device by layer deposition and layer structuring in the first substrate; connecting the first substrate to a second substrate using metallic bonding; thinning back the first substrate to a provided thickness of a functional layer; forming movable MEMS elements in the functional layer; removing the sacrificial layer in a region underneath the movable MEMS elements; and connecting the first substrate to a third substrate, fashioned as a cap wafer, by a metallic bond connection.

In an advantageous example embodiment of the micromechanical sensor, an etch stop layer is situated between the sacrificial layer and the electrode device. In this way, a well-defined open space is advantageously fashioned underneath the movable MEMS elements, and unintentional underetching of the wiring layers is avoided.

In an advantageous example embodiment of the micromechanical sensor, a mechanical functional layer of the first substrate contains monocrystalline silicon. In this way, mechanical properties of the mechanical functional layer are very well defined, and in addition in this way a low degree of scatter of functional parameters can be realized in production.

In an advantageous example embodiment of the micromechanical sensor, an electrical connection through all the substrates is produced by the two metallic bond connections. In this way, a possibility is provided for connecting electrical circuit structures of the two substrates to each other in electrically conductive fashion, or also for producing an electrical connection through all three substrates. In this way, the component can be electrically connected to a fourth substrate, e.g., a circuit board, and to a fifth substrate, e.g., a further component.

In an advantageous example embodiment of the micromechanical sensor, a first cavity is fashioned in the second substrate. This cavity can enclose a gas volume that is advantageous for a specific sensor topology. In addition, the effect of externally acting mechanical stress is advantageously attenuated by the first cavity of the second substrate.

In an advantageous example embodiment of the micromechanical sensor, a second cavity is formed in the second substrate. In this way, two micromechanical sensors can be realized on one component.

In an advantageous example embodiment of the micromechanical sensor, a cap cavity is fashioned in the third substrate. In this way, a gas volume can be enclosed in the cap cavity in order to realize a specific sensor topology.

In an advantageous example embodiment of the micromechanical sensor, a through-opening is fashioned between the first cavity of the second substrate and the cap cavity of the third substrate. In this way, a pressure compensation between the caverns in different substrates is advantageously supported.

In an advantageous example embodiment of the micromechanical sensor, different pressures are fashioned in the two cavities. In this way, different sensor topologies can be realized on a single component, for example in the form of a rotational rate sensor and acceleration sensor.

In an example embodiment of the micromechanical sensor, the micromechanical sensor is fashioned as an acceleration sensor, rotational rate sensor, or pressure sensor. In this way, different sensor topologies can advantageously be realized by the proposed micromechanical sensor.

In the following, example embodiments of the present invention is described in detail, with further features and advantages, on the basis of a plurality of figures. Identical or functionally identical elements have identical reference characters. The figures are intended in particular to illustrate the essential principles of the present invention, and are not necessarily true to scale. For better clarity, it may be that not all reference characters are entered in all the figures.

Disclosed method features result analogously from corresponding disclosed device features, and vice versa. This means in particular that features, technical advantages, and embodiments relating to the micromechanical sensor result analogously from corresponding features, technical advantages, and embodiments relating to the method for producing a micromechanical sensor, and vice versa.

DETAILED DESCRIPTION

Example embodiment of the present invention provide a micromechanical sensor having a high degree of detection quality. The proposed micromechanical sensor and the associated production method can result in the realization of highly sensitive micromechanical inertial components.

Figure 1:
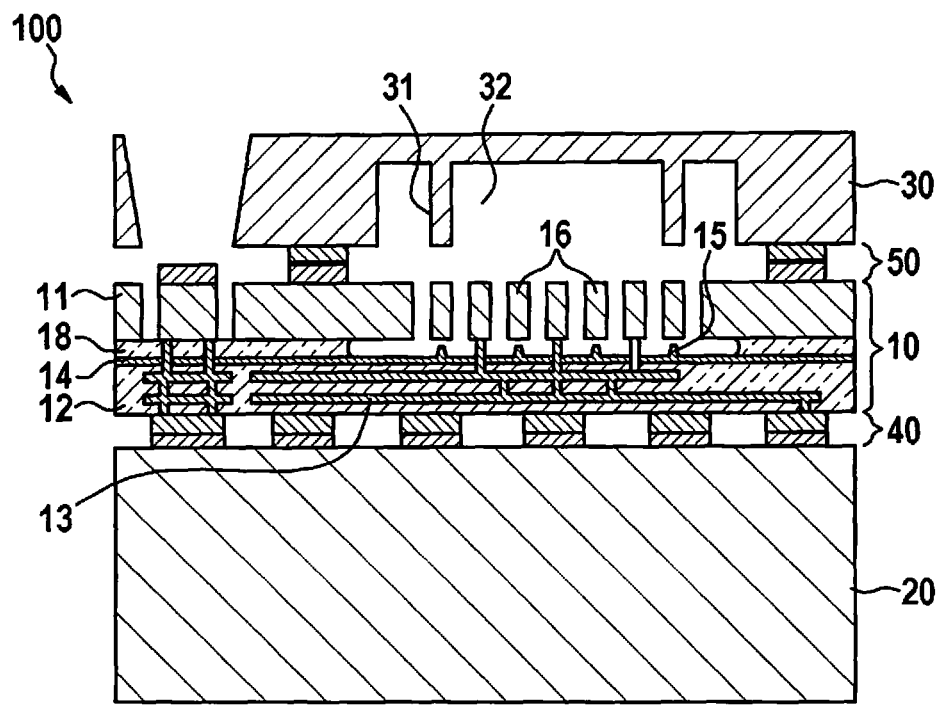
FIG. 1 shows a cross-sectional view of a micromechanical sensor according to a first example embodiment of the present invention.

FIG. 1 schematically shows a simplified cross-sectional view through a first example embodiment of a micromechanical sensor 100. Visible is a first substrate 10 in which a mechanical functional layer 11 (e.g., monocrystalline or polycrystalline silicon) is fashioned, movable micromechanical elements 16 (MEMS elements) being fashioned in mechanical functional layer 11.

In comparison with polycrystalline material, monocrystalline material has the advantage that its mechanical properties are very defined, which has the effect of low scatter of functional parameters of the finished components in production.

On first substrate 10, through a layer deposition process there is further fashioned a sacrificial layer 18 (e.g., $SiO_2$), at least one electrically conductive wiring layer 13 (e.g., tungsten, aluminum), and insulating layers 12 (e.g., $SiO_2$), vertical electrodes for the movable MEMS elements 16 and supply lines for the horizontal electrodes being realized by wiring layers 13. In addition, in first substrate 10 an etch stop layer 14 is visible, e.g., in the form of SiCN or Si-rich nitride. Etch stop layer 14 prevents an attack on the insulating layers, and thus underetching of wiring layers 13, during a sacrificial layer etching process (e.g., using hydrofluoric acid vapor).

As a result, in this way in first substrate 10 a low-ohmic wiring is fashioned having electrode structures on first mechanical functional layer 11.

During operation of micromechanical sensor 100, movable MEMS elements 16 interact with the horizontal electrodes of first functional layer 10 and the vertical electrodes in wiring layers 13, and, when there is a defined movement of movable MEMS elements 16, they capacitively generate an electrical measurement signal of micromechanical sensor 100.

With sacrificial layer 18 fashioned by layer deposition on first substrate 10 and with a well-defined positioning of electrodes in wiring layers 13 on first substrate 10, the positioning including a very precisely dimensioned spacing of the electrodes from the movable MEMS elements 16, as a result, a precise realization of a capacitive measurement design is thus possible in particular for the vertical electrodes and the associated movable MEMS elements 16 when there is a vertical deflection of movable MEMS elements 16.

In first substrate 10, stop elements 15 can be seen on etch stop layer 14, which are intended to prevent adhesion of movable MEMS elements 16.

First substrate 10 is eutectically connected to second substrate 20 by metallic bond connections 40. In addition, first substrate 10 is connected to a cap wafer 30 by further metallic bond connections 50. In both cases, the bond connections include a hermetically sealed bond frame that runs peripherally around MEMS elements 16, in order to enable targeted setting of a pressure in the interior of the micromechanical sensor. Before the application of cap wafer 30, first substrate 10 is thinned back to the provided thickness of functional layer 11, e.g., by a grinding process, the bonding material is applied, MEMS elements 16 are structured out from the functional layer, and sacrificial layer 18 is at least partly removed.

At least one stop element 31, intended to prevent adhesion of movable MEMS element 16, is fashioned in cap wafer 30. Metallic bond connections 40, 50 have the advantage that only low demands are made on the bonding partners with regard to surface characteristics, so that surface roughness, and even particles that may be present on the bonding surfaces, are less critical, because they "sink in" in a liquid phase of the eutectic bond connection.

Examples of suitable metallic bonding methods are Al—Ge, Au—Si, Cu—Sn, Al—Al, Cu—Cu, Au—Au. Here, different material systems, having different re-melting points, are preferably used for bond connections 40, 50, in order to prevent the first bond connection from melting again during the second bonding process. Advantageously, in this way the yield is increased and production costs are lowered.

The metallic bond connections 40 to second substrate 20 can either be made over the whole surface or can be structured as shown in FIG. 1. A bonding boundary surface between first substrate 10 and second substrate 20 is here dimensioned such that adequate strength of the overall system is provided, advantageously resulting in adequate rigidity of the overall system, and thus resulting in a low degree of bending (wafer bow) of the system in an automatic production process (e.g., using robotic systems) (bow engineering).

Figure 2:
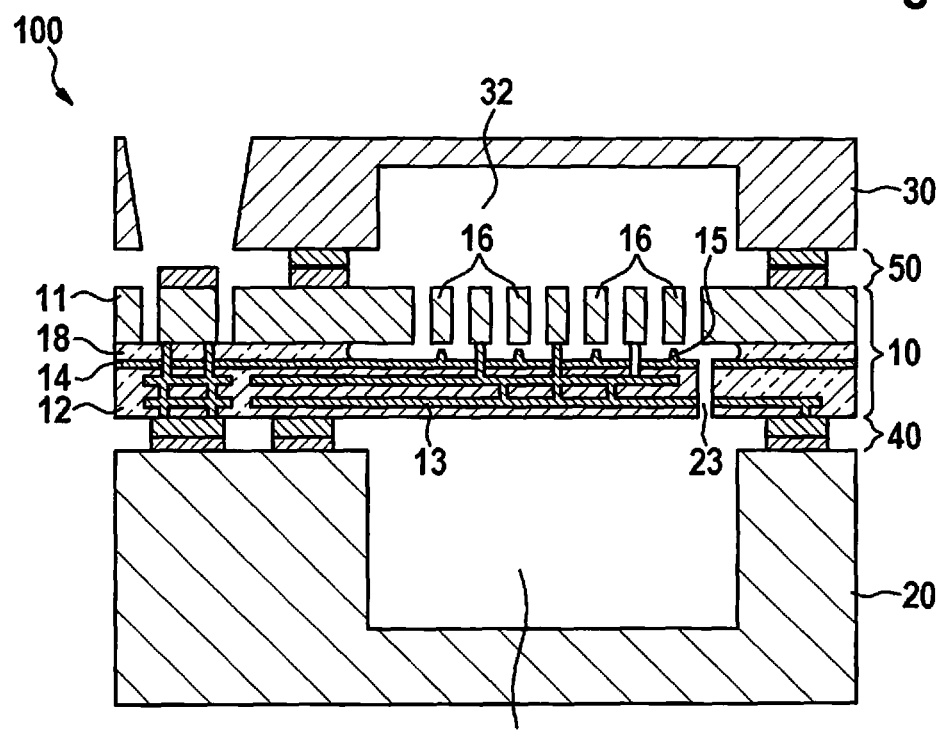
FIG. 2 shows a cross-sectional view of a micromechanical sensor according to a second example embodiment of the present invention.

FIG. 2 shows a cross-section through a second example embodiment of micromechanical sensor 100.

It can be seen that in this example embodiment a first cavity 21 is fashioned in second substrate 20 ("buried cavern"). It can be seen that cap cavity 32 of third substrate 30 and first cavity 21 of second substrate 20 are connected by a through-opening 23. This enables a pressure or fluid compensation between cap cavity 32 and first cavity 21 in second substrate 20.

First cavity 21 in second substrate 20 can optionally also contain support columns and/or support walls (not shown) having a bond connection to first substrate 10 situated there-above. These support elements provide an adequate anchoring of the various elements on second substrate 20 situated below them.

An additional cavern volume provides a lower pressure increase per outgassed molecule in first cavity 21, and thus for more stable pressure conditions overall. In addition, buried first cavity 21 results in a stress decoupling relative to stress coupled into micromechanical sensor 100 from outside. In addition, with the additional cavern volumes of first cavity 21, parasitic capacitances of wiring layers 13 with second substrate 20 are significantly reduced.

Figure 3:
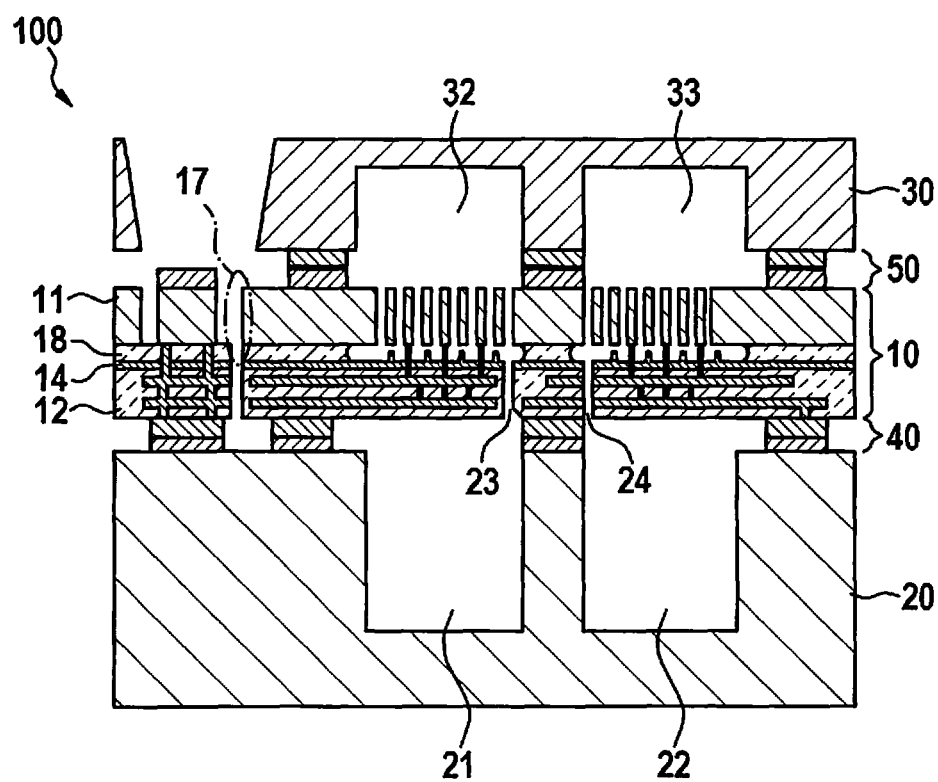
FIG. 3 shows a cross-sectional view of a micromechanical sensor according to a third example embodiment of the present invention.

FIG. 3 shows a cross-sectional view through a third example embodiment of micromechanical sensor 100. It can be seen that in this variant, a further cavity 22 is fashioned in second substrate 20. In addition, it can be seen that a further cap cavity 33 is also fashioned in third substrate 30. The named cap cavities 32, 33 of third substrate 30 are connected fluidically with cavities 21, 22 of second substrate 20 by through-openings 23, 24.

A sealing region 17 is visible for the hermetic sealing of a pressure access opening fashioned under it.

As a result, when there is a plurality of caverns hermetically sealed from each other, communicating pressure access holes through first substrate 10 are realized. The pressure access hole of a cavity can be sealed by a later method step at a different gas pressure (for example by local melting using a laser) than a different cavity already sealed previously during the bonding. In combined acceleration-rotational rate components, it is particularly advantageous if different internal pressures are enclosed in cavities 21, 22 or 32, 33.

Figure 4:
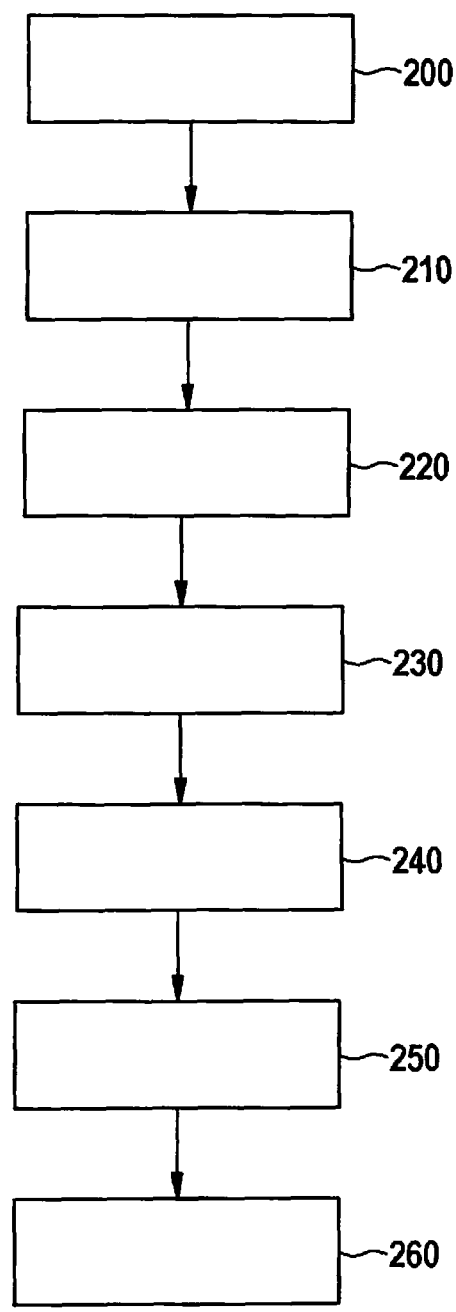
FIG. 4 is a flowchart that illustrates a schematic flow of a method for producing a micromechanical sensor, according to an example embodiment of the present invention.

FIG. 4 shows a schematic example flow of a method for producing a micromechanical sensor.

In a step 200, a first substrate 10 is provided.

In a step 210, an application is carried out of a sacrificial layer 18 onto first substrate 10, and a formation is carried out of an electrode device 13, as well as, if warranted, of a metallic bonding material, by layer deposition, and a layer structuring is carried out in first substrate 10.

In a step 220, first substrate 10 is connected to a second substrate 20 by metallic bonding.

In a step 230, first substrate 10 is thinned back to a provided thickness of a functional layer 11, and metallic bonding material is applied and structured.

In a step 240, a formation is carried out of movable MEMS elements 16 in functional layer 11.

In a step 250, sacrificial layer 18 is removed in a region underneath movable MEMS elements 16.

In a step 260, first substrate 10 is connected to a third substrate 30, fashioned as cap wafer, by a metallic bond connection.

In summary, the present invention proposes a micromechanical sensor and a method for its production with which a precise, well-defined distance between electrodes, in particular vertical electrodes, and the associated movable MEMS elements is provided in that the named elements are realized by a sacrificial layer deposition process on a single substrate.

In this way, for example Coriolis forces, which can manifest as out-of-plane deflections of the movable MEMS elements in a micromechanical sensor fashioned as a rotational rate sensor, can advantageously be capacitively acquired very precisely.

Although the present invention has been described above on the basis of concrete practical examples, the person skilled in the art can also realize specific embodiments not disclosed above, or disclosed above only partially, without departing from the core of the present invention.

What is claimed is:

1. A micromechanical sensor comprising
   a base substrate;
   a cap substrate; and
   a third substrate that is connected to each of the base and cap substrates by respective metallic bond connections, and that includes:
      a mechanical functional layer including movable elements;
      an electrode device for acquiring an indication of a movement of the moveable elements and fashioned by layer deposition;
      a layer of sacrificial material that is lower than the mechanical function layer, and includes portions beyond opposite ends of the movable elements, no part of the layer being in a region underneath the movable elements, and
      an etch stop layer between the sacrificial layer and the electrode device.

2. The micromechanical sensor of claim 1, wherein the mechanical functional layer includes monocrystalline silicon.

3. The micromechanical sensor of claim 2, wherein the metallic bond connections provide an electrical connection through the cap substrate, third substrate, and base substrate.

4. The micromechanical sensor of claim 1, wherein a first cavity is fashioned in the base substrate.

5. The micromechanical sensor of claim 4, wherein a second cavity is fashioned in a second substrate.

6. The micromechanical sensor of claim 5, wherein different pressures are in the first and second cavities.

7. The micromechanical sensor of claim 4, wherein a cap cavity is fashioned in the cap substrate.

8. The micromechanical sensor of claim 7, wherein a through-opening extends from the first cavity to the cap cavity.

9. The micromechanical sensor of claim 1, wherein a cap cavity is fashioned in a third substrate.

10. The micromechanical sensor of claim 1, wherein the micromechanical sensor is an acceleration sensor.

* * * * *